(12) United States Patent
Li et al.

(10) Patent No.: US 7,124,503 B1
(45) Date of Patent: Oct. 24, 2006

(54) METHOD FOR FORMING MULTILAYER CIRCUIT BOARD

(75) Inventors: Delin Li, Canton, MI (US); Jay D. Baker, Dearborn, MI (US); Myron Lemecha, Dearborn Heights, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 336 days.

(21) Appl. No.: 09/655,893

(22) Filed: Sep. 6, 2000

(51) Int. Cl.
*H01K 3/10* (2006.01)

(52) U.S. Cl. .......................... 29/852; 29/830; 29/840; 29/843; 29/846; 29/847; 174/255

(58) Field of Classification Search .......... 29/830–834, 29/846–852, 853, 840; 174/255, 257, 261, 174/262, 265, 267; 351/772, 777; 257/737
See application file for complete search history.

(56) References Cited

U.S. PATENT DOCUMENTS

| 3,801,388 | A | | 4/1974 | Akiyama et al. |
| 4,404,059 | A | | 9/1983 | Livshits et al. |
| 5,384,955 | A | * | 1/1995 | Booth et al. ................... 29/830 |
| 5,509,200 | A | * | 4/1996 | Frankeny et al. ............. 29/852 |
| 5,738,797 | A | | 4/1998 | Belke, Jr. et al. |
| 6,248,247 | B1 | * | 6/2001 | Goenka et al. ................ 216/15 |
| 6,475,703 | B1 | * | 11/2002 | Li et al. ...................... 430/313 |
| 6,501,031 | B1 | * | 12/2002 | Glovatsky et al. .......... 174/262 |
| 6,722,031 | B1 | * | 4/2004 | Japp et al. ..................... 29/852 |

* cited by examiner

*Primary Examiner*—Minh Trinh
(74) *Attorney, Agent, or Firm*—Brinks Hofer Gilson & Lione

(57) ABSTRACT

A method for forming connections within a multi-layer electronic circuit board 10 which allows for the selective, efficient, and reliable interconnection between at least one conductive layer and a ground plane or layer.

16 Claims, 5 Drawing Sheets

METHOD FOR FORMING MULTILAYER CIRCUIT BOARD

(1) FIELD OF THE INVENTION

The present invention relates to a method for making an electrical circuit board and more particularly, to a method for making a multi-layer electrical circuit board having interconnections between portions or layers of the circuit board.

(2) BACKGROUND OF THE INVENTION

Multi-layer circuit boards contain and/or include electrical components which selectively and operatively populate opposed first and second surfaces (i.e., top and bottom surfaces) of each board (or other respective interior portions of each of the boards), thereby desirably allowing each of the electrical circuit boards to contain and/or include a relatively large amount of electrical components which efficiently and densely populate the respective boards.

It is desirable to allow for communication by and between and/or interconnection of the component containing surfaces and/or portions of an electrical circuit board, thereby allowing the contained electrical components on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of various contained components.

One common type of interconnection utilized and/or formed within these types of circuit boards is a connection from a conductive layer or member to a ground layer or ground plane. Conventional methods for connecting a conductive layer or member to a ground plane include "wire bonding" and "end soldering". These conventional methods however cannot be used within multi-layer electronic circuit boards, due to the inherent structure of the boards. Moreover, other prior methods for physically and electrically interconnecting conductive layers or portions and ground layers or portions of multi-layer circuit boards are often relatively complicated, costly and time consuming. These prior methods have also resulted in relatively unreliable or defective connections to be formed, thereby causing certain portions of the formed circuit boards to be unusable or to malfunction.

There is therefore a need for a method for producing a multi-layer electrical circuit board which overcomes some or all of the previously delineated drawbacks of prior circuit boards and which provides for relatively uncomplicated and reliable physical and electrical interconnections between conductive layers and ground layers of the circuit board.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the invention to provide a method for producing a multi-layer electrical circuit board which allows for the selective, efficient, and reliable interconnection between at least one conductive layer to a ground plane or layer.

According to a first aspect of the present invention, a method for forming a connection within a multi-layer circuit board is provided. The multi-layer circuit board includes a first pre-circuit assembly including a conductive core member, a dielectric member which is attached to a top surface of the conductive core member, an adhesive layer which is coupled to a top surface of the dielectric member, and a second pre-circuit assembly including a second core member and a first and second conductive member which are respectively attached to a top and bottom surface of the second core member. The method includes the steps of: selectively forming at least one hole through the first pre-circuit assembly in a location where a connection to the conductive core is desired to be formed; registering the second pre-circuit assembly with respect to the first pre-circuit, effective to cause a portion of the second conductive member to reside above the at least one hole; attaching the second pre-circuit assembly to the adhesive layer; and selectively inserting a solderable material within the at least one hole, effective to connect the portion of the second conductive member to the conductive core member.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
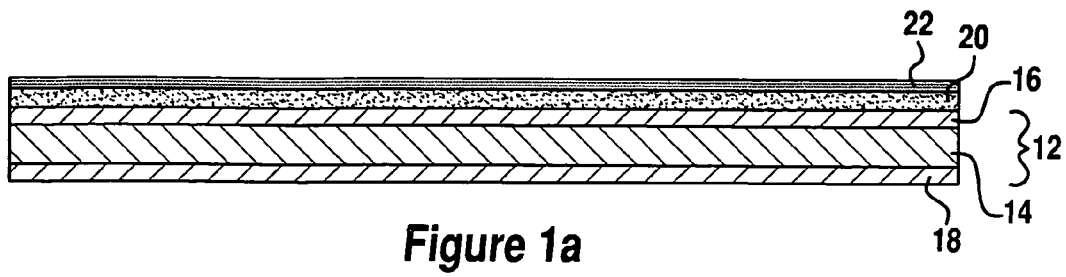
FIGS. 1(a)–(e) are successive sectional side views of a multi-layer circuit board being produced and/or formed in accordance with the teachings of a first embodiment of the invention.

Referring now to FIGS. 1(a)–(e), there is shown a method for interconnecting layers of a circuit board assembly 10, which is performed in accordance with the teachings of the preferred embodiment of the invention.

Circuit board assembly 10 is formed by "building up" or sequentially adding various layers of certain materials to a substrate, pre-circuit assembly or tri-metal film 12. Pre-circuit assembly 12 includes a core metal portion 14, which is preferably manufactured and/or formed from a conventional aluminum material, and a pair of electrically conductive layers 16, 18 which are respectively attached to the opposing surfaces (e.g., top and bottom surfaces) of core metal portion 12 and which are preferably manufactured and/or formed from a conventional solderable material (e.g. copper). While copper and aluminum are used to form circuit board 10 in the preferred embodiment of the invention, it should be appreciated that other metals and metal combinations can be used to form circuit boards described herein, and may include metals such as iron, nickel, silver, gold, tin and alloys thereof. A dielectric layer 20 is attached/coupled to the top surface of conductive layer 16, and a conventional adhesive layer 22 is applied to and substantially covers the top surface of layer 20. In one non-limiting embodiment, dielectric layer 20 may range from approximately one millimeter to several millimeters in thickness, and adhesive layer 22 may range from approximately 0.5 millimeters to several millimeters in thickness.

Figure 1B:
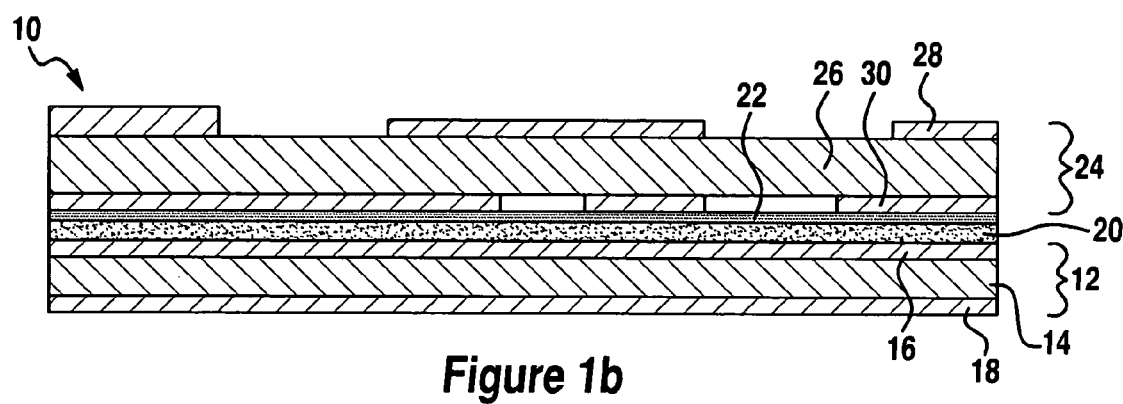

As shown in FIG. 1(b), a second pre-circuit assembly 24, including a core member 26 which is substantially similar to member 14 and a pair of conductive members or layers 28, 30 which are respectively substantially similar to layers 16, 18, is attached to pre-circuit assembly 12. Particularly, pre-circuit assembly 24 is attached to pre-circuit assembly 12 by use of an adhesive layer 22 which operatively bonds the conductive layer 30 of pre-circuit assembly 24 to dielectric layer 20. In one non-limiting embodiment of the invention, pre-circuit assembly 24 and/or electrically conductive member 30 is connected, coupled, and/or attached to layer 20 by adhesive 22 by use of a known and conventional laminating process such as a conventional "one-step" laminating process.

Figure 1C:
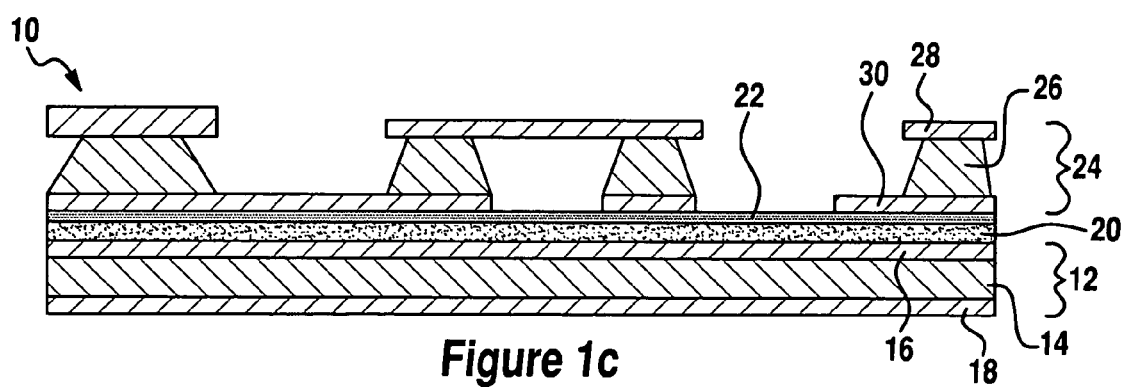
Figure 1D:
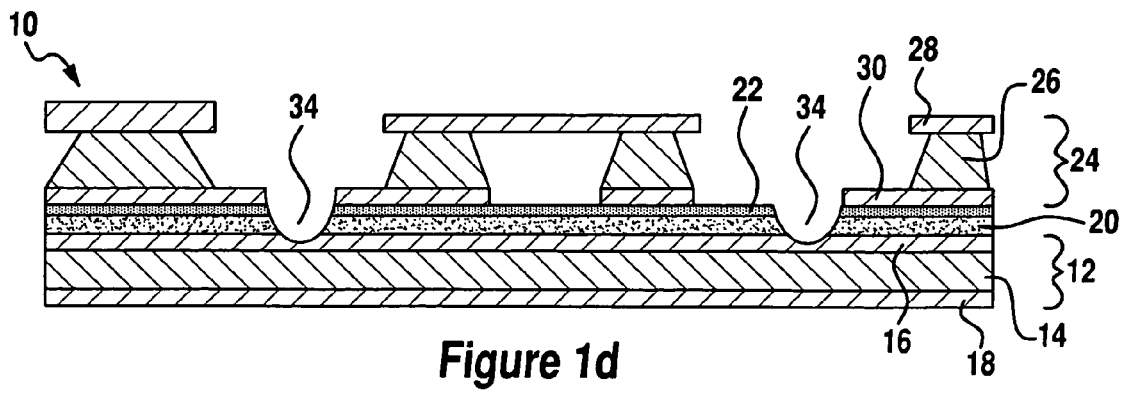

After assembly 24 is attached to layer 22, aluminum member 26 is selectively etched away to form the circuit board illustrated in FIG. 1(c). Next, portions of portions of dielectric layer 20, adhesive layer 22 and conductive layer 30 are locally, mechanically and/or chemically removed from areas of circuit board 10 where connections between conductor 30 and substrate metal 16 are desired to be formed, thereby forming holes, cavities or vias 34 illustrated in FIG. 1(d). In the preferred embodiment of the invention, a conventional drilling device and/or procedure is used to selectively remove areas of layers 20, 22. In alternate embodiments, other conventional removal processes are utilized.

Figure 1E:
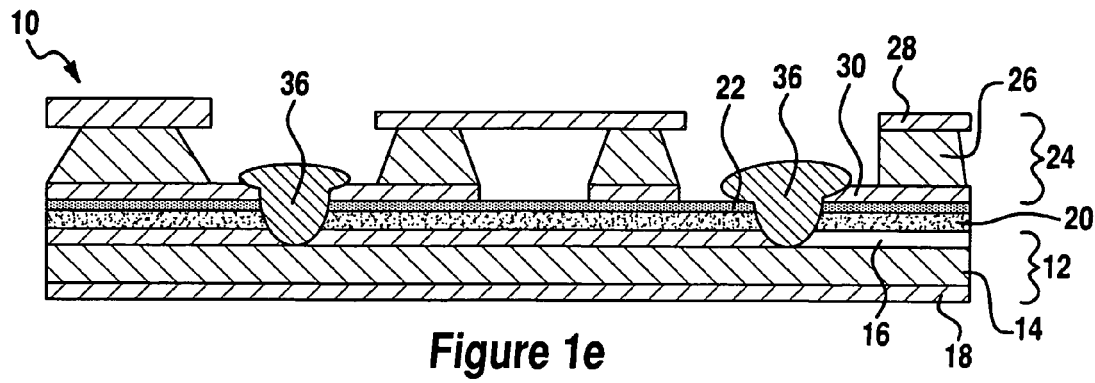

Finally, as illustrated in FIG. 1(e), amounts of a solder or conductive material 36 are selectively inserted into the formed vias 34 after the portions of layers 30, 22 and 20 have been selectively removed. The solder or conductive material 36 is effective to provide a robust and reliable connection between layers 30 and 16. In the preferred embodiment of the invention, solder material 36 is selectively inserted or deposited into vias 34 in a molten state. In alternative embodiments, solder material 36 is selectively inserted or deposed into vias 34 by use of a conventional compression printing technique. In other alternate embodiments, solder material 36 may be selectively inserted into vias 34 by use of a laser solder, reflow, wave solder or other conventional soldering method.

Referring now to FIGS. 2(a)–(e), there is shown a method for interconnecting layers of a circuit assembly 50, which is performed in accordance with the teachings of a second embodiment of the invention. Circuit assembly 50 is formed by "building up" or sequentially adding various layers of certain materials to a "substrate" portion 52. Substrate portion 52 includes a core metal portion or ground layer 54, which is preferably manufactured and/or formed from a conventional solderable material (e.g. copper). A dielectric layer 56 is attached/coupled to the top surface of conductive layer 54 in a conventional manner, and an conventional adhesive layer 58 is applied to and substantially covers the top surface of layer 56. In one non-limiting embodiment, dielectric layer 58 may comprise conventional and commercially available "PET", "PEN" or FR-4 material.

Figure 2A:
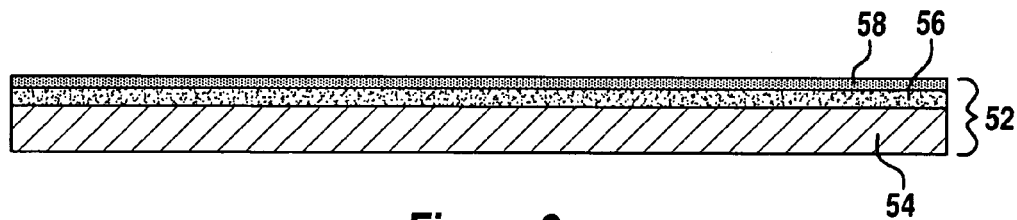
FIGS. 2(a)–(e) are successive sectional side views of a multi-layer circuit board being produced and/or formed in accordance with the teachings of a second embodiment of the invention.
Figure 2B:
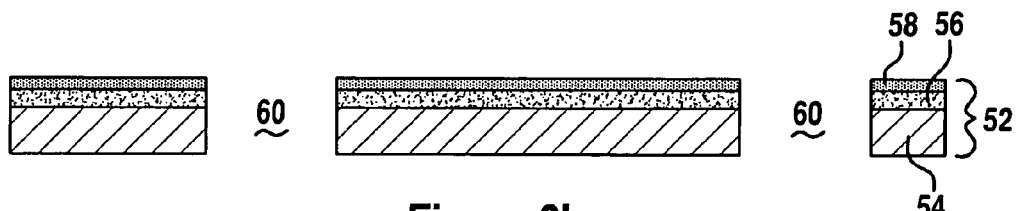
Figure 2C:
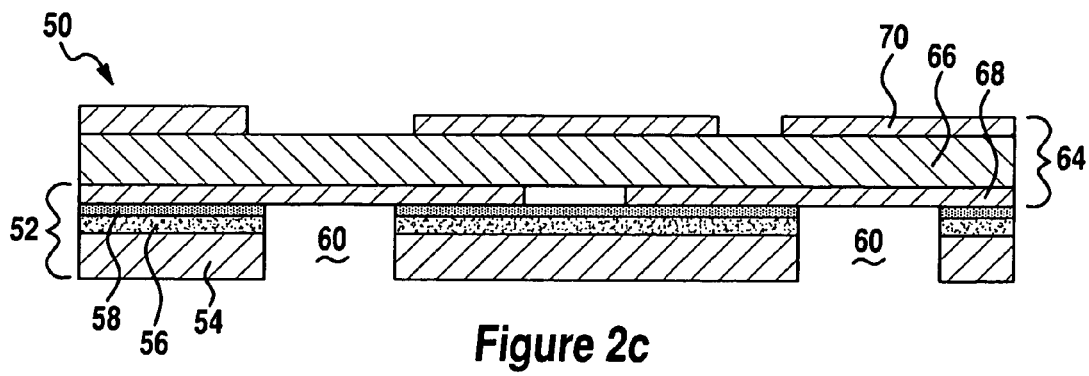

In the first step of the process, as shown in FIG. 2(b), through holes or vias 60 are formed through substrate portion 52 in a conventional manner (e.g., by drilling). The through holes 60 are formed in locations where connections between ground member 54 and other portions of the circuit 50 are desired to be formed. After vias 60 are formed, a second pre-circuit assembly 64 is attached to substrate portion 52, as shown in FIG. 2(c). Assembly 64 includes a core metal portion 66, which is preferably manufactured and/or formed from a conventional aluminum material, and a pair of electrically conductive layers 68, 70 which are respectively attached to the opposing surfaces (e.g., top and bottom surfaces) of core metal portion 66 and which are preferably manufactured and/or formed from a conventional solderable material (e.g. copper). Pre-circuit assembly 64 is "registered" with respect to holes 60 (e.g., portions of conductive layer 68 which are desired to be connected to ground member 54 are aligned with through holes 60), and is attached to adhesive layer 58 which operatively bonds the conductive layer 68 of pre-circuit assembly 64 to dielectric layer 56. When pre-circuit assembly 64 is attached to dielectric layer 56, portions of conductive layer 68 which are to be connected to core member 54 extend within or above apertures 60. In one non-limiting embodiment of the invention, pre-circuit assembly 64 and/or electrically conductive member 68 is connected, coupled, and/or attached to adhesive material 58 by use of a known and conventional laminating process such as a conventional "one-step" laminating process.

Figure 2D:
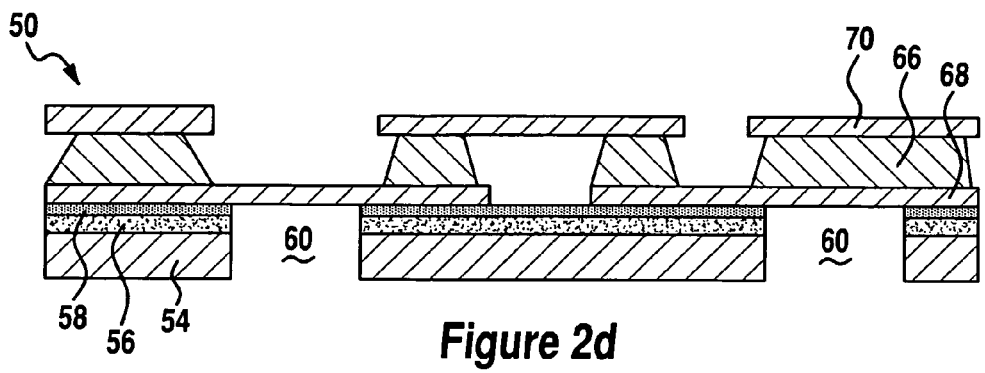
Figure 2E:
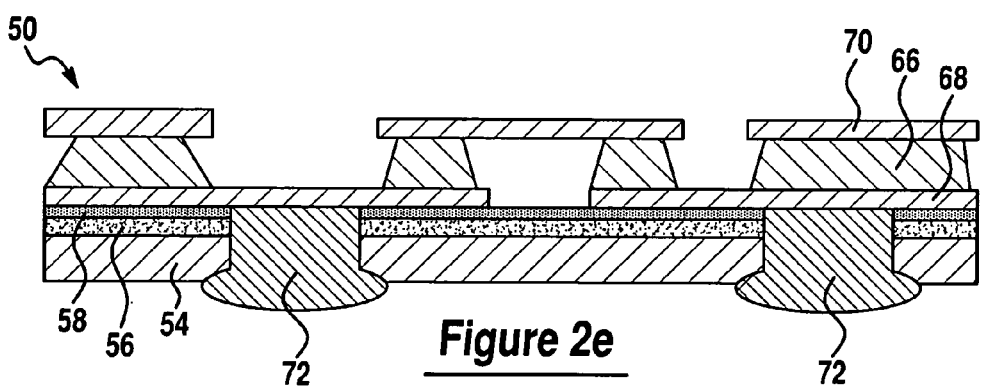

After pre-circuit assembly 64 is attached to layer 58, portions of aluminum member 66 are selectively and conventionally etched away to form the two-layer circuit board illustrated in FIG. 2(d). Finally, as illustrated in FIG. 2(e), a solder or conductive material 72 is selectively inserted into the apertures 60. The conductive material 72 is effective to provide a robust and reliable connection between layers 54 and 68 (e.g. between core layer 54 and the portions of layer 68 which are disposed within or above apertures 60). In the preferred embodiment of the invention, solder material 72 is selectively inserted or deposited into vias 60 in a molten state. In alternative embodiments, solder material 72 is selectively inserted or deposited into vias 60 by use of a conventional compression printing technique. In other alternate embodiments, solder material 72 may be selectively inserted into vias 60 by use of a laser solder, reflow, wave solder or other conventional soldering method.

Referring now to FIGS. 3(a)–(e), there is shown a method for interconnecting layers of a circuit assembly 80, which is performed in accordance with the teachings of the preferred embodiment of the invention. Circuit assembly 80 is formed by "building up" or sequentially adding various layers of certain materials to a "substrate" portion 82, which is substantially identical to substrate portion 52. Particularly, substrate portion 82 includes a ground layer or core metal portion 84, which is preferably manufactured and/or formed from a conventional solderable material (e.g. copper). A dielectric layer 86 is attached/coupled to the top surface of conductive layer 84 in a conventional manner, and an conventional adhesive layer 88 is applied to and substantially covers the top surface of layer 86.

Figure 3A:
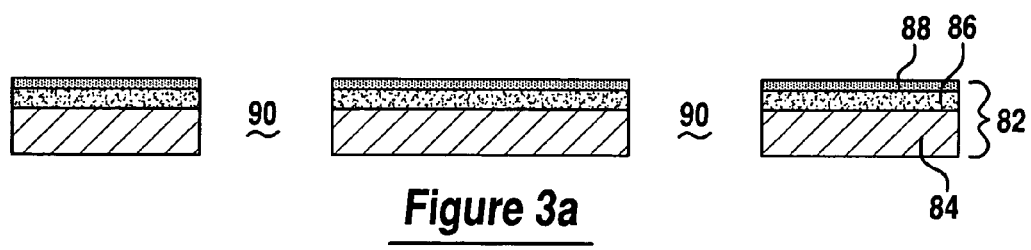
FIGS. 3(a)–(e) are successive sectional side views of a multi-layer circuit board being produced and/or formed in accordance with the teachings of a third embodiment of the invention.
Figure 3B:
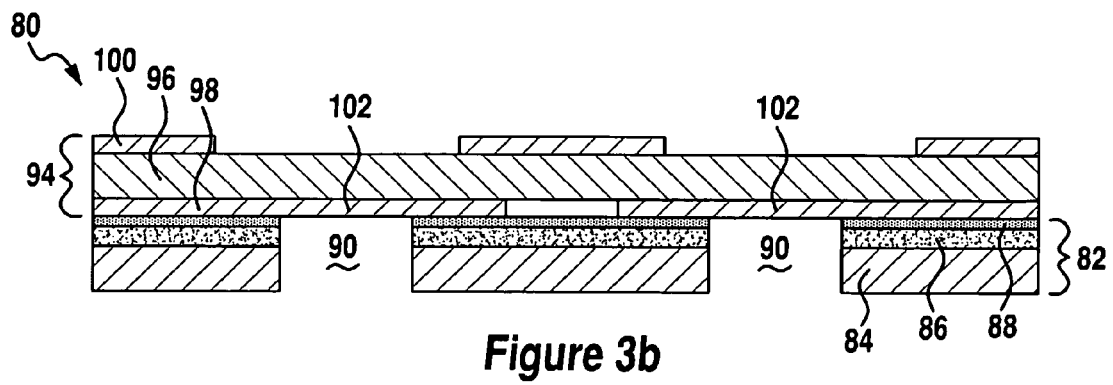

In the first step of the process, as shown in FIG. 3(a), through holes or vias 90 are formed through substrate portion 82 in a conventional manner (e.g., by drilling). The through holes 90 are formed in locations where connections between ground member 84 and other portions of the circuit 80 are desired to be formed. After vias 90 are formed, a second pre-circuit assembly 94 is attached to substrate portion 82, as shown in FIG. 3(b). Assembly 94 includes a core metal portion 96, which is preferably manufactured and/or formed from a conventional aluminum material, and a pair of electrically conductive layers 98, 100 which are respectively attached to the opposing surfaces (e.g., top and bottom surfaces) of core metal portion 96 and which are preferably manufactured and/or formed from a conventional solderable material (e.g. copper). Pre-circuit assembly 94 is registered with respect to apertures 90 such that a portion of conducting layer 98 resides above each aperture 90 and such that conducting layer 100 does not reside above either aperture 90 (e.g., portions of conducting layer 98 which are desired to be connected to ground member 84 are aligned with through holes 90). Pre-circuit assembly 94 is then attached to adhesive layer 88 which operatively bonds the conductive layer 98 of pre-circuit assembly 94 to dielectric layer 86. When pre-circuit assembly 94 is attached to dielectric layer 56, portions of conductive layer 98 which are to be connected to core member 84 (e.g. portions 102) are disposed within or above apertures 90. In one non-limiting embodiment of the invention, pre-circuit assembly 94 and/or electrically conductive member 98 is connected, coupled, and/or attached to adhesive material 88 by use of a known and conventional laminating process such as a conventional "one-step" laminating process.

Figure 3C:
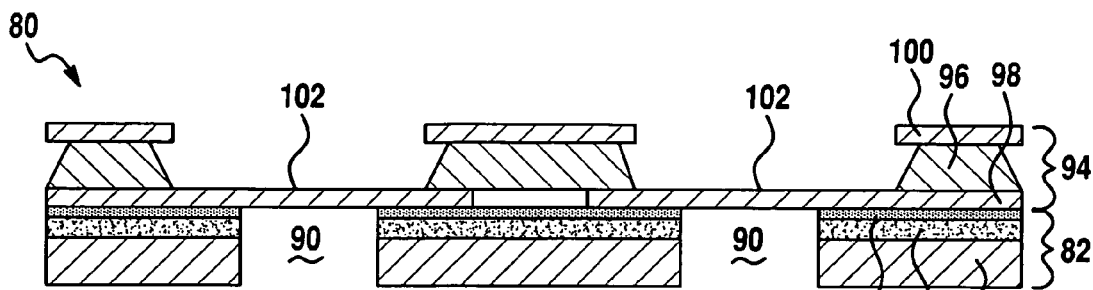
Figure 3D:
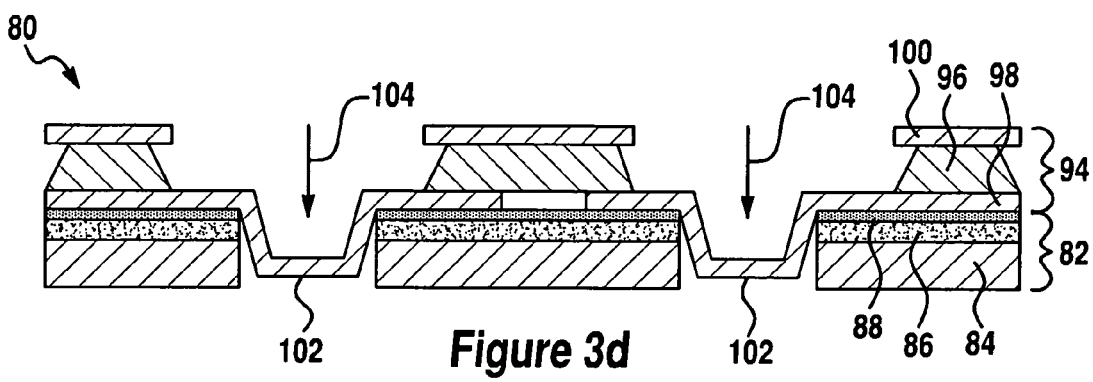
Figure 3E:
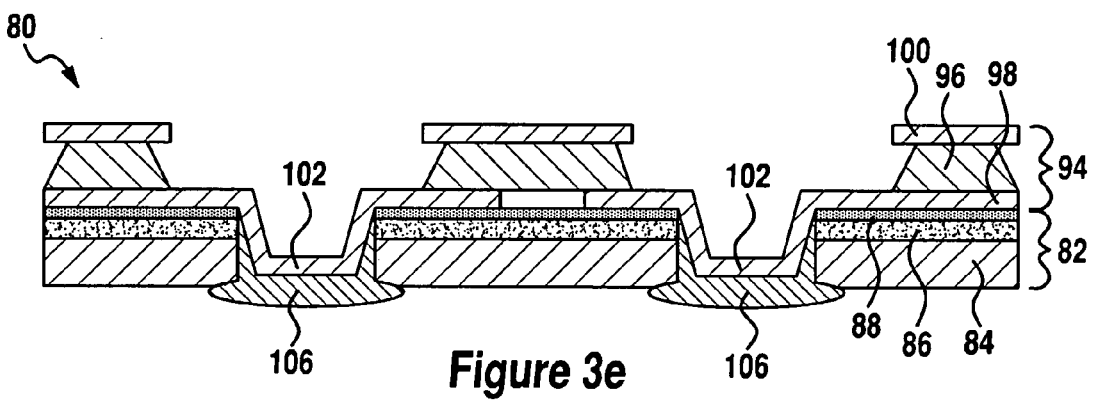

After assembly 94 is attached to layer 88, portions of aluminum member 96 are selectively and conventionally etched away to form the two-layer circuit board illustrated in FIG. 3(c). Particularly, once portions of aluminum member 96 have been etched away, bridge portions 102 of member 98 remain extended across apertures 90. In the next step of the method, a force is imparted on bridge portions 102 in the direction of arrows 104, as illustrated in FIG. 3(d). In the preferred embodiment, bridge portions 102 are "punched" downward in the direction of arrows 104 by a conventional punching process and/or tool. Finally, as illustrated in FIG. 3(e), amounts of a solder or conductive material 106 are selectively inserted into the apertures 90. The solder material 106 is effective to provide a more robust and reliable connection between layer 84 and layer 98 (e.g., bridges 102). In the preferred embodiment of the invention, solder material 106 is selectively inserted or deposited into vias 90 in a molten state. In alternative embodiments, solder material 106 is selectively inserted or deposed into vias 90 by use of a conventional compression printing technique. In other alternate embodiments, solder material 106 may be selectively inserted into vias 90 by use of a laser solder, reflow, wave solder or other conventional soldering method.

Referring now to FIGS. 4(a)–(e), there is shown a method for interconnecting layers of a circuit assembly 110, which is performed in accordance with the teachings of the preferred embodiment of the invention. Circuit assembly 110 is formed by "building up" or sequentially adding various layers of certain materials to a "substrate" portion or first pre-circuit assembly 112, which is substantially identical to substrate portion 52. Particularly, the first pre-circuit assembly 112 is made of a ground layer 114, which is preferably manufactured and/or formed from a conventional solderable material (e.g. copper) a dielectric layer 116 is attached/coupled to the top surface of conductive the ground layer 114 in a conventional manner, and a conventional adhesive layer 118 is applied to and substantially covers the top surface of the dielectric layer 116.

Figure 4A:
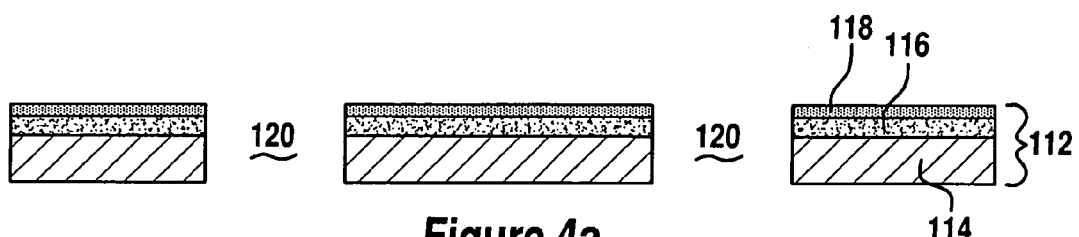
FIGS. 4(a)–(e) are successive sectional side views of a multi-layer circuit board being produced and/or formed in accordance with the teachings of a fourth embodiment of the invention.
Figure 4B:
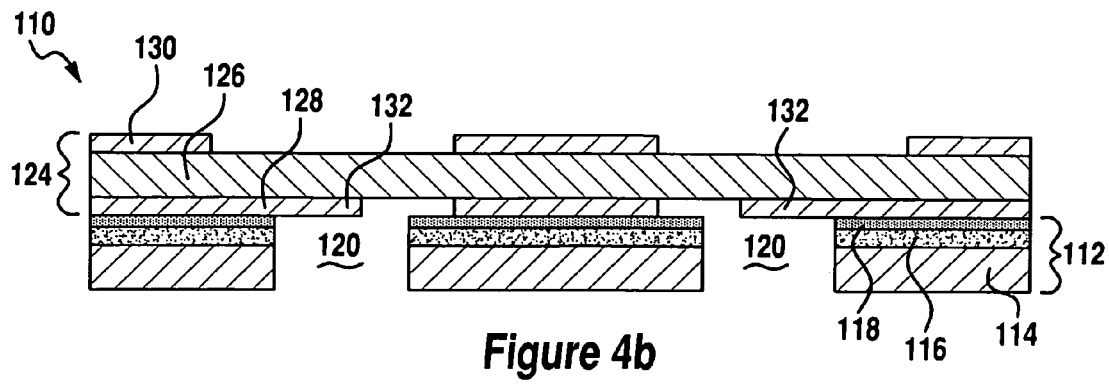

In the first step of the process, as shown in FIG. 4(a), through holes or apertures 120 are formed through the first pre-circuit assembly 112 in a conventional manner (e.g., by drilling). The apertures 120 are formed in locations where connections between ground layer 114 and other portions of the circuit 110 are desired to be formed. After apertures 120 are formed, a second pre-circuit assembly 124 is attached to the first pre-circuit assembly 112, as shown in FIG. 4(b). The second pre-circuit assembly 124 includes a core metal portion 126, which is preferably manufactured and/or formed from a conventional aluminum material, a first conducting layer 128, and a second conducting layer 130 which are respectively attached to the opposing surfaces (e.g., top and bottom surfaces) of the core metal portion 126 and which are preferably manufactured and/or formed from a conventional solderable material (e.g. copper). The second pre-circuit assembly 124 is aligned with respect to apertures 120 such that a portion of the first conducting layer 128 resides above each aperture 120 and such that the second conducting layer 130 does not reside above either aperture 120 (e.g., portions of the first conducting layer 128 which are desired to the connected to ground layer 114 are aligned with apertures 12C). The second pre-circuit assembly 124 is then attached to adhesive layer 118 which bonds the first conducting layer 128 of the second pre-circuit assembly 124 to dielectric layer 116. When the second pre-circuit assembly 124 is attached to dielectric layer 116, bridge portions 132 of conductive layer 128, which are to be connected to ground ere member 114, extend within or above apertures 120. In one non-limiting embodiment of the invention, the second pre-circuit assembly 124 and/or the first conducting layer 128 is connected, coupled, and/or attached to adhesive layer 118 by use of a known and conventional laminating process such as a conventional "one-step" laminating process.

Figure 4C:
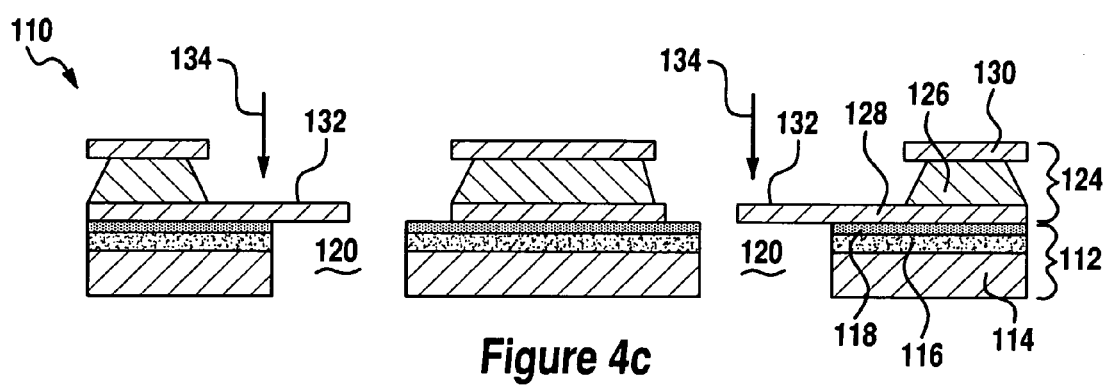
Figure 4D:
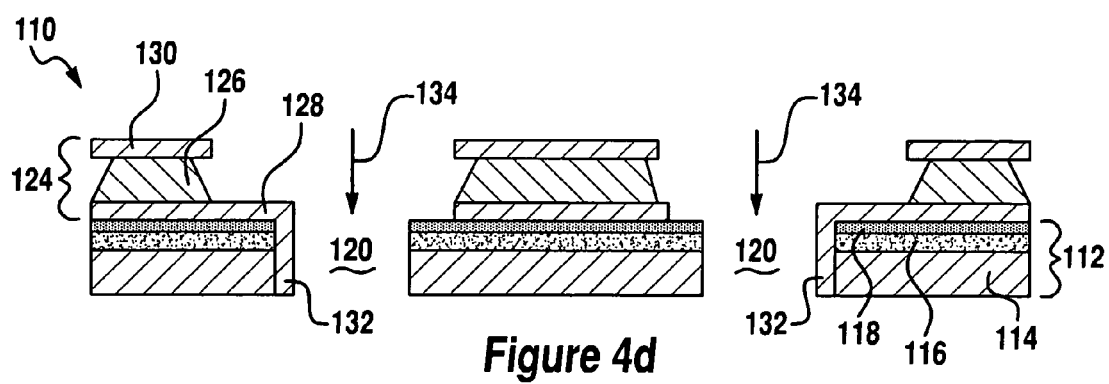
Figure 4E:
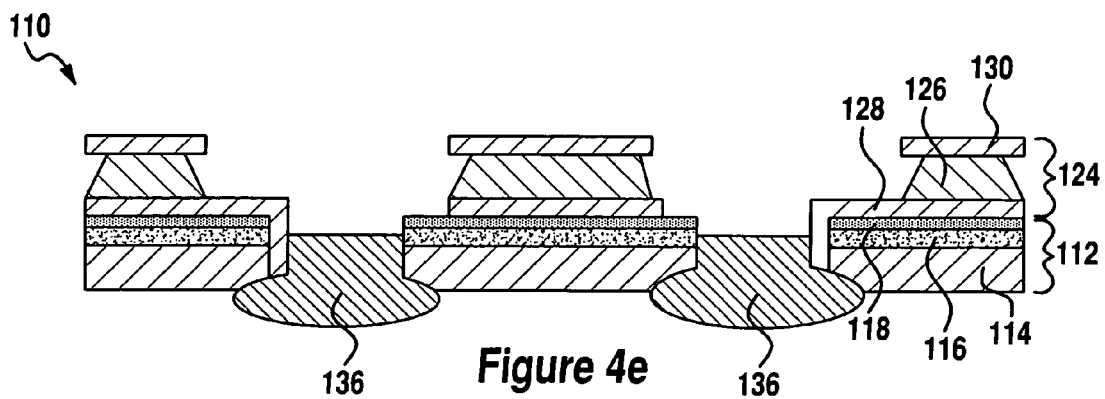

After the second pre-circuit assembly 124 is attached to the adhesive layer 118, portions of the core metal portion 126 are selectively and conventionally etched away to form the two-layer circuit board illustrated in FIG. 4(c). Particularly, once portions of the core metal portion 126 have been etched away, protrusions, tab members or bridge portions 132 of the first conducting layer 128 remain partially extended across apertures 120. In the next step of the method, a force is imparted upon bridge portions 132 in the direction of arrows 134, as illustrated in FIG. 4(d). In the preferred embodiment of the invention, bridge portions 132 are "punched" downward in the direction of arrows 134 by a conventional punching process and/or tool, thereby causing bridge portions 132 to abuttingly engage the side walls of the apertures 120. Finally, as illustrated in FIG. 4(e), amounts of a conductive or solder material 136 are selectively inserted into the apertures 120. The solder material 136 is effective to provide a more robust and reliable connection between the ground layer 114 and the first conducting layer 128. In the preferred embodiment of the invention, solder material 136 is selectively inserted or deposited into apertures 120 in a molten state. In alternative embodiments, solder material 136 is selectively inserted or deposed into apertures 120 by use of a conventional compression printing technique. In other alternate embodiments, solder material 136 may be selectively inserted into apertures 120 by use of a laser solder, reflow, wave solder or other conventional soldering method.

It should be understood that the invention is not limited to the exact embodiment or construction which has been illustrated and described but that various changes may be made without departing from the spirit and the scope of the invention.

What is claimed is:

1. A method for forming a connection within a multi-layer circuit board, said multi-layer circuit board including a first pre-circuit assembly including a conductive core member, a dielectric member which is attached to a top surface of said conductive core member, and a second pre-circuit assembly including a second core member and a first and second conductive member which are respectively attached to a top and bottom surface of said second core member, said method comprising the steps of:

selectively forming at least one hole through said first pre-circuit assembly in a location where a connection to said conductive core member is desired to be formed;

registering said second pre-circuit assembly with respect to said first pre-circuit, effective to cause a portion of said second conductive member to reside above said at least one hole;

attaching said second pre-circuit assembly to said dielectric member; and selectively inserting a conductive material within said at least one hole, effective to connect said portion of said second conductive member to said conductive core member.

2. The method of claim 1 further comprising the step of: selectively etching at least a portion of said second core member.

3. The method of claim 1 wherein said conductive material comprises solder.

4. The method of claim 3 wherein said solder is selectively inserted into said at least one hole by use of a compression printing technique.

5. The method of claim 1 wherein said conductive core member is manufactured from a copper material.

6. The method of claim 1 wherein said first and said second conductive member each comprises a copper member.

7. The method of claim 1 wherein said second core member comprises an aluminum member.

8. The method of claim 1, further comprising the step of coupling an adhesive layer to the dielectric member.

9. A method for forming a connection within a multi-layer circuit board, said multi-layer circuit board including a first pre-circuit assembly including a conductive core member, a dielectric member which is attached to a top surface of said conductive core member, and a second pre-circuit assembly including a second core member and a first and second conductive member which are respectively attached to a top and bottom surface of said second core member, said method comprising the steps of:

selectively forming at least one hole through said first pre-circuit assembly in a location where a connection to said conductive core member is desired to be formed;

registering said second pre-circuit assembly with respect to said first pre-circuit, effective to cause a portion of said second conductive member to reside above said at least one hole;

attaching said second pre-circuit assembly to said dielectric member;

selectively inserting a conductive material within said at least one hole, effective to connect said portion of said second conductive member to said conductive core member;

selectively removing areas of said second pre-circuit assembly which are disposed above said first portion of the second conductive member of said second pre-circuit assembly, thereby exposing said first portion of said second conductive member; and deforming said first portion of said second conductive member, effective to cause said first portion of said second pre-circuit assembly to extend within said hole.

10. The method of claim 9 wherein said first portion of said second pre-circuit assembly comprises a bridge portion.

11. The method of claim 9 wherein said first portion of said second pre-circuit assembly comprises a tab portion.

12. The method of claim 9 further comprising the step of selectively etching at least a portion of said second core member.

13. The method of claim 9 wherein said conductive material comprises solder.

14. The method of claim 9 wherein said first and said second conductive member each comprises a copper member.

15. The method of claim 9 wherein said second core member comprises an aluminum member.

16. The method of claim 9, further comprising the step of coupling an adhesive layer to the dielectric member.

* * * * *